United States Patent
Kamitsubo

(10) Patent No.: US 11,856,693 B2
(45) Date of Patent: Dec. 26, 2023

(54) RESIN MULTILAYER SUBSTRATE AND METHOD FOR MANUFACTURING RESIN MULTILAYER SUBSTRATE

(71) Applicant: Murata Manufacturing Co., Ltd., Nagaokakyo (JP)

(72) Inventor: Yusuke Kamitsubo, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 45 days.

(21) Appl. No.: 17/584,499

(22) Filed: Jan. 26, 2022

(65) Prior Publication Data

US 2022/0151065 A1  May 12, 2022

Related U.S. Application Data

(63) Continuation of application No. PCT/JP2020/029853, filed on Aug. 4, 2020.

(30) Foreign Application Priority Data

Aug. 8, 2019  (JP) .................. 2019-146235

(51) Int. Cl.
*H05K 1/03* (2006.01)
*B29C 43/28* (2006.01)
*B29C 43/30* (2006.01)
*H05K 1/02* (2006.01)
*H05K 3/00* (2006.01)
*B29K 101/12* (2006.01)
*B29L 31/34* (2006.01)

(52) U.S. Cl.
CPC ........... *H05K 1/0306* (2013.01); *B29C 43/28* (2013.01); *B29C 43/305* (2013.01); *H05K 1/0296* (2013.01); *H05K 3/0014* (2013.01); *B29K 2101/12* (2013.01); *B29L 2031/34* (2013.01)

(58) Field of Classification Search
CPC ...... H05K 1/03; H05K 1/0306; H05K 1/0296; H05K 3/0014; B29C 43/28; B29C 43/305
USPC ....................................... 174/255
See application file for complete search history.

(56) References Cited

U.S. PATENT DOCUMENTS

| 4,639,693 A | 1/1987 | Suzuki et al. |
| 2010/0230151 A1 | 9/2010 | Michalk |
| 2019/0228900 A1 | 7/2019 | Iida |

FOREIGN PATENT DOCUMENTS

| JP | 02-47607 Y2 | 12/1990 |
| WO | 2018/074139 A1 | 4/2018 |

OTHER PUBLICATIONS

Official Communication issued in International Patent Application No. PCT/JP2020/029853, dated Oct. 20, 2020.

*Primary Examiner* — Tremesha S Willis
(74) *Attorney, Agent, or Firm* — Keating & Bennett, LLP

(57) ABSTRACT

A resin multilayer substrate includes a stacked body provided by stacking and thermocompression bonding resin layers, a first conductor pattern inside the stacked body, and a first protective coating covering at least a first surface and a side surface of the first conductor pattern. The resin layers are made of a first thermoplastic resin, and the first protective coating is made of a second thermoplastic resin. Both of the first and second thermoplastic resins soften at a predetermined press temperature or less. The second thermoplastic resin has a storage modulus lower than a storage modulus of the first thermoplastic resin at a temperature equal to or less than the predetermined press temperature and equal to or more than room temperature.

17 Claims, 11 Drawing Sheets

Fig.3
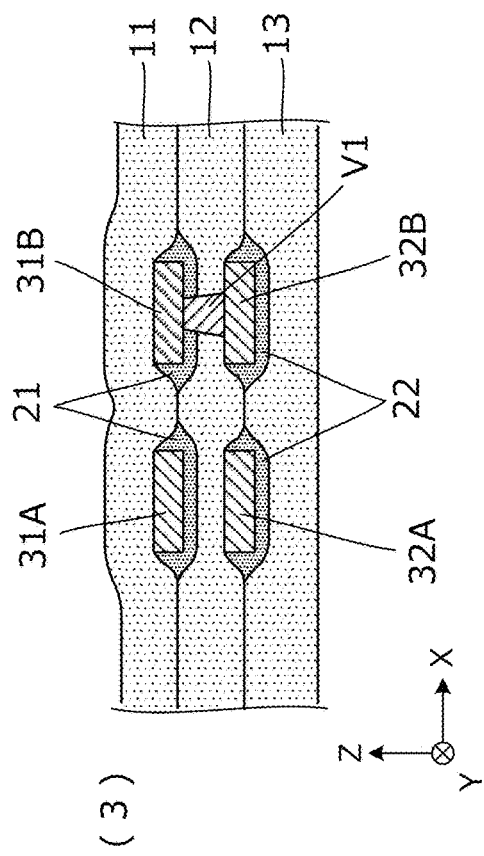
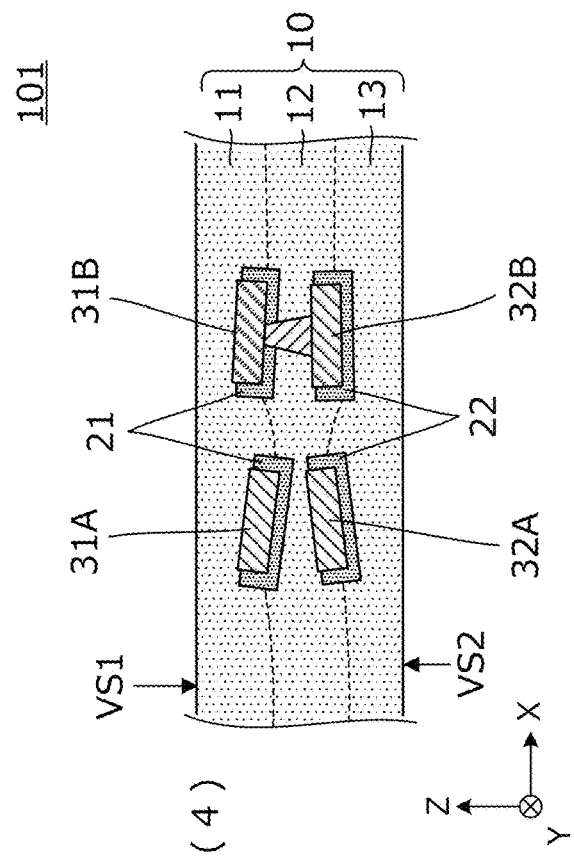
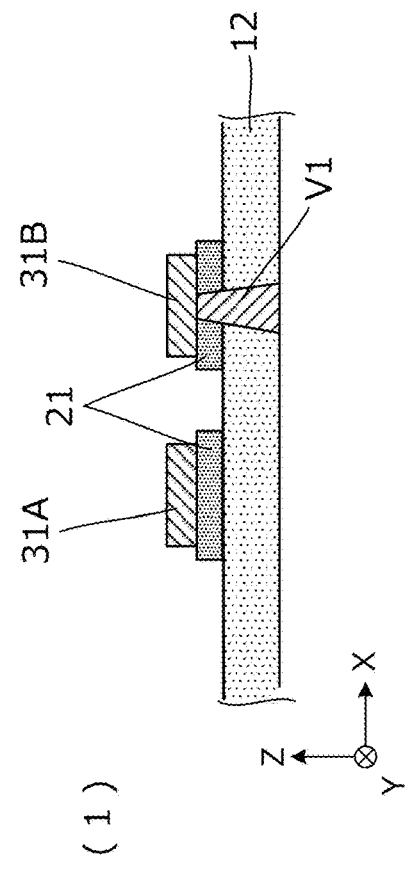
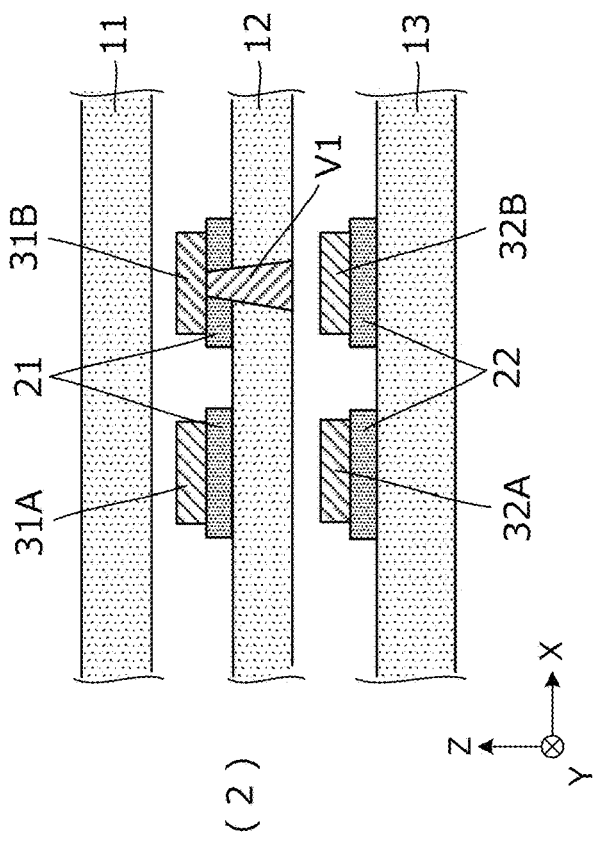

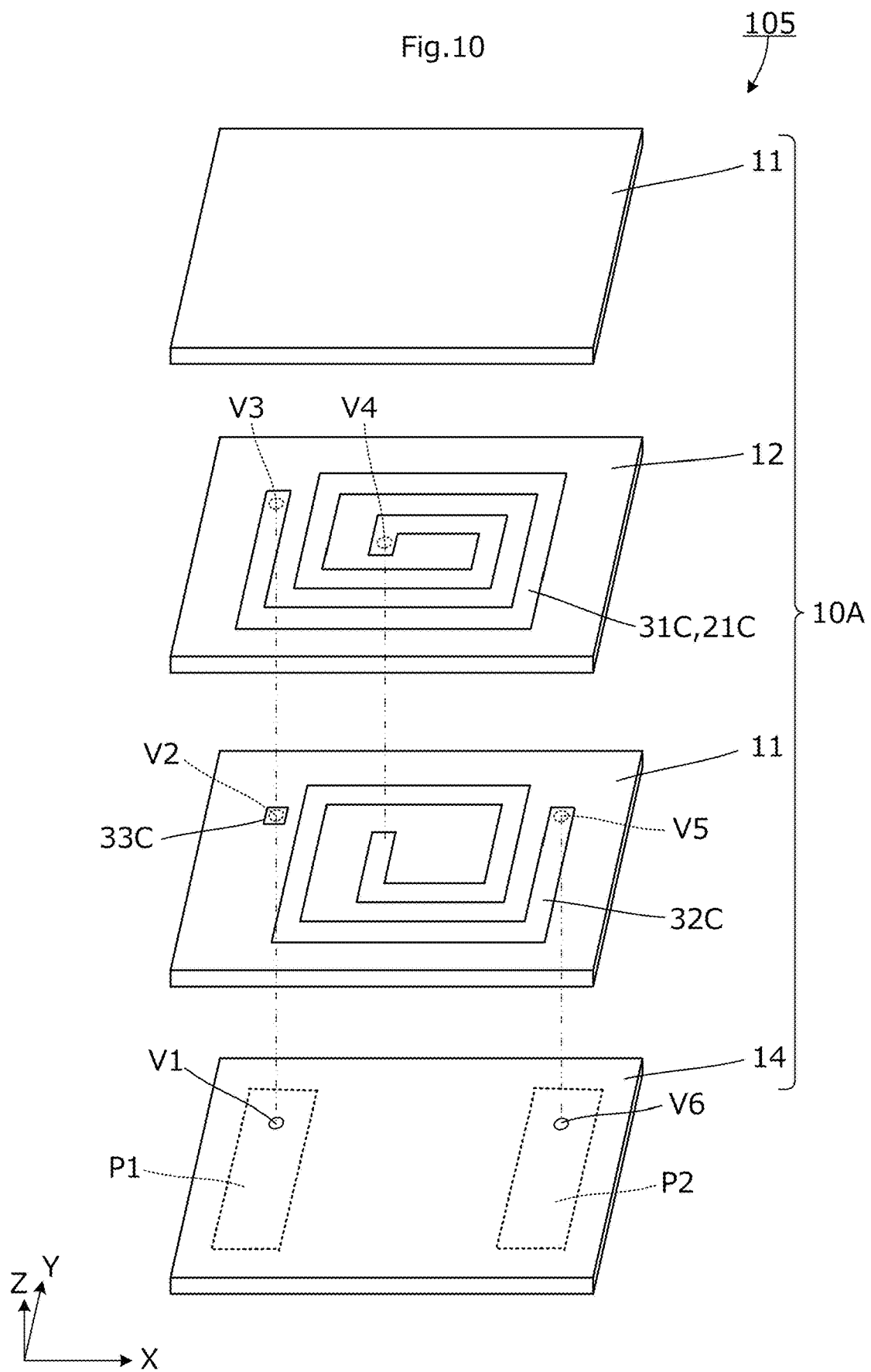

RESIN MULTILAYER SUBSTRATE AND METHOD FOR MANUFACTURING RESIN MULTILAYER SUBSTRATE

CROSS REFERENCE TO RELATED APPLICATIONS

This application claims the benefit of priority to Japanese Patent Application No. 2019-146235 filed on Aug. 8, 2019 and is a Continuation Application of PCT Application No. PCT/JP2020/029853 filed on Aug. 4, 2020. The entire contents of each application are hereby incorporated herein by reference.

BACKGROUND OF THE INVENTION

1. Field of the Invention

The present invention relates to a resin multilayer substrate and a method for manufacturing a resin multilayer substrate formed by stacking resin layers made from thermoplastic resin.

2. Description of the Related Art

Conventionally, a resin multilayer substrate including a stacked body formed by stacking and thermocompression-bonding a plurality of resin layers made from thermoplastic resin and a conductor pattern formed on the stacked body is known.

For example, International Publication No. 2018/074139 discloses a resin multilayer substrate in which a protective coating is formed on at least one surface side of a conductor pattern in order to prevent short circuiting between conductor patterns due to misalignment of the conductor patterns caused by flowing of a resin layer during thermocompression bonding. The protective coating is a protective film of thermosetting resin that is thermally cured at a temperature lower than a press temperature at the time of thermocompression bonding, or an oxide film.

However, the protective coating shown in International Publication No. 2018/074139 has a lower fluidity at a press temperature during thermocompression bonding than the resin layer, and a step portion (from a surface of the resin layer) formed by the protective coating and the conductor pattern is large during thermocompression bonding. For this reason, when a plurality of resin layers are stacked and thermocompression bonded so that the conductor pattern is covered with the resin layer, it is difficult to change the shape of the resin layer along the shape of the conductor pattern and the protective coating, and a gap due to the step portion after thermocompression bonding may be generated and may cause peeling of the resin multilayer substrate or the like. Note that, if high pressure or high temperature is applied during thermocompression bonding in order to prevent generation of the above gap, the flow of the resin layer becomes large and an electrical characteristic of the resin multilayer substrate is likely to change due to misalignment of the conductor pattern.

In particular, in a case where the protective coating is formed of an oxide film, a heating step or the like for forming the oxide film on the surface of the conductor pattern provided on the resin layer is required, which complicates a manufacturing step. Further, when a high temperature is applied in the heating step, the resin layer and the conductor pattern may be deformed or misaligned, and an electrical characteristic of the resin multilayer substrate after thermocompression bonding (after lamination) may change.

SUMMARY OF THE INVENTION

Preferred embodiments of the present invention provide resin multilayer substrates in each of which generation of a gap inside a stacked body after thermocompression bonding can be reduced or prevented while short circuiting between conductor patterns is reduced or prevented by covering the conductor patterns with a protective coating, and methods for manufacturing such resin multilayer substrates.

A resin multilayer substrate according to a preferred embodiment of the present invention includes a stacked body including a plurality of resin layers made of a first thermoplastic resin and stacked, a first conductor pattern inside the stacked body, and a first protective coating made of a second thermoplastic resin stacked and thermocompression bonded, the first protective coating being inside the stacked body and covering at least a first surface and a side surface of the first conductor pattern. The first thermoplastic resin and the second thermoplastic resin soften at a predetermined press temperature or less, and the second thermoplastic resin has a storage modulus lower than a storage modulus of the first thermoplastic resin at a temperature equal to or less than the predetermined press temperature and equal to or more than room temperature.

A resin multilayer substrate according to a preferred embodiment of the present invention includes a stacked body including a plurality of resin layers made of a first thermoplastic resin and stacked, a first conductor pattern inside the stacked body, and a first protective coating made of a second thermoplastic resin that are stacked and thermocompression bonded, the first protective coating being inside the stacked body and covering at least a first surface and a side surface of the first conductor pattern. The first thermoplastic resin and the second thermoplastic resin soften at a predetermined press temperature or less, and the second thermoplastic resin has a softening point lower than a softening point of the first thermoplastic resin.

According to the above-described configurations, even if a gap is generated around the first conductor pattern after the temperature is lowered and a plurality of the resin layers are cured after heating at the time of forming the stacked body, the gap is filled with the softened first protective coating provided around the first conductor pattern. For this reason, the generation of a gap inside the stacked body after thermocompression bonding is reduced or prevented, and layer peeling starting from the gap is reduced or prevented.

Further, according to the above-described configurations, the first thermoplastic resin (a plurality of the resin layers) cures before the second thermoplastic resin (the first protective coating) as the temperature decreases after heating at the time of forming the stacked body. In this manner, the first protective coating in a softened state is restrained by the first thermoplastic resin, a large flow of the first protective coating is reduced or prevented, and a large deformation and misalignment of the first conductor pattern are reduced or prevented. For this reason, it is possible to reduce or prevent a change in an electrical characteristic due to deformation and misalignment of the first conductor pattern after thermocompression bonding.

A method for manufacturing a resin multilayer substrate according to a preferred embodiment of the present invention includes forming a first protective coating made of a second thermoplastic resin having a storage modulus at a temperature equal to or less than the predetermined press temperature and equal to or more than room temperature lower than the first thermoplastic resin on a first resin layer of a plurality of resin layers made of a first thermoplastic resin, forming a first conductor pattern on a surface of the first protective coating, and stacking a plurality of the resin layers including the first resin layer after forming the first conductor pattern and thermocompression bonding a plurality of the resin layers at a predetermined press temperature to form a stacked body, and covering, with the first protective coating, at least a first surface and a side surface of the first conductor pattern inside the stacked body.

When a plurality of resin layers stacked so as to cover a conductor pattern including a protective coating on the first surface with the resin layer are thermocompression bonded, it is difficult to change the shape of the resin layer along the shape of the conductor pattern, and a gap is likely to be generated in the step portion formed by the protective coating and the conductor pattern after thermocompression bonding. Then, in a case where there is a gap at an interface of different materials, layer peeling is likely to occur starting from the gap. In contrast, according to the above-described manufacturing method, even if a gap is generated around the first conductor pattern when the temperature is lowered after heating by thermocompression bonding, the shape of the softened first protective coating existing around the first conductor pattern changes, and the above gap is filled. That is, according to the above-described manufacturing method, it is not necessary to apply high pressure or high temperature during thermocompression bonding so as not to generate a gap inside the stacked body.

After heating by thermocompression bonding, the first thermoplastic resin (a plurality of resin layers) is cured before the second thermoplastic resin (first protective coating) as the temperature is lowered. In this manner, since the first protective coating in a softened state is restrained by the first thermoplastic resin, a large flow of the first protective coating is reduced or prevented, and a large deformation and misalignment of the first conductor pattern are reduced or prevented.

Further, for example, in a case where the protective coating is formed of an oxide film, a heating step or the like for forming the oxide film on the surface of the conductor pattern provided on the resin layer is required, which complicates the manufacturing step. Furthermore, when a high temperature is applied in the heating step, the conductor pattern may be deformed or misaligned due to flow of the resin layer, and an electrical characteristic of the resin multilayer substrate after thermocompression bonding may change. In contrast, according to the above-described manufacturing method, a resin multilayer substrate having a structure in which at least the first surface and a side surface of the first conductor pattern are covered with the first protective coating can be obtained only by thermocompression bonding (heat pressing) a plurality of the resin layers. For this reason, the manufacturing step of the resin multilayer substrate 101 is reduced, and the cost can be reduced.

According to a preferred embodiment of the present invention, a resin multilayer substrate in which generation of a gap inside a stacked body after thermocompression bonding can be reduced or prevented while short circuiting between conductor patterns is reduced or prevented by covering the conductor patterns with a protective coating can be achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A is a cross-sectional view of the resin multilayer substrate 101 in a stage after thermocompression bonding, and is a cross-sectional view taken along line A-A in FIG. 1. FIG. 2B is a cross-sectional view of the resin multilayer substrate 101 in a stage before thermocompression bonding.

FIG. 3 is a cross-sectional view illustrating a manufacturing step of the resin multilayer substrate 101 in order.

FIG. 7A is a cross-sectional view of the resin multilayer substrate 103 in a stage after thermocompression bonding, and FIG. 7B is a cross-sectional view of the resin multilayer substrate 103 in a stage before thermocompression bonding.

FIG. 8A is a cross-sectional view of the resin multilayer substrate 104 in a stage after thermocompression bonding, and FIG. 8B is a cross-sectional view of the resin multilayer substrate 104 in a stage before thermocompression bonding.

FIG. 10 is an exploded perspective view of the resin multilayer substrate 105.

FIG. 11A is a cross-sectional view of the resin multilayer substrate 105 in a stage after thermocompression bonding, and is a cross-sectional view taken along line B-B in FIG. 9. FIG. 11B is a cross-sectional view of the resin multilayer substrate 105 in a stage before thermocompression bonding.

DETAILED DESCRIPTION OF THE PREFERRED EMBODIMENTS

Figure 1:
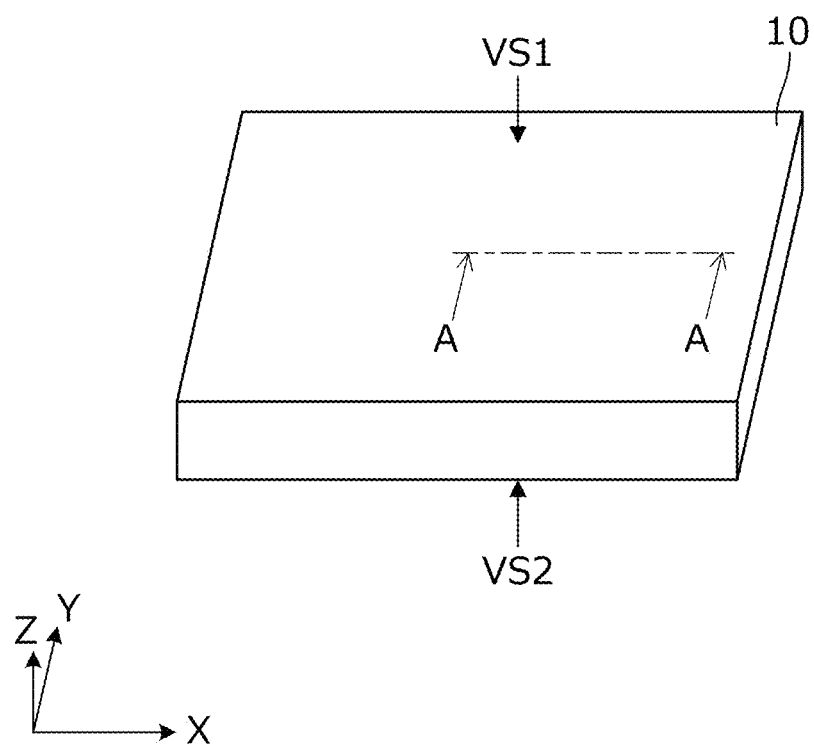
FIG. 1 is an external perspective view of a resin multilayer substrate 101 according to a first preferred embodiment of the present invention.

Preferred embodiments of the present invention will be shown and described with reference to specific examples and the drawings. The same reference numerals are assigned to the same or corresponding portions in each figure. Although the preferred embodiments are shown separately for convenience in consideration of the explanation of a main point or the ease of understanding, partial replacement or combination of configurations shown in different preferred embodiments is possible. In second and subsequent preferred embodiments, the description of matters common to the first preferred embodiment will be omitted, and only differences will be described. In particular, the same advantageous actions and effects due to the same or substantially the same configurations will not be described for each preferred embodiment.

First Preferred Embodiment

Figure 2A:
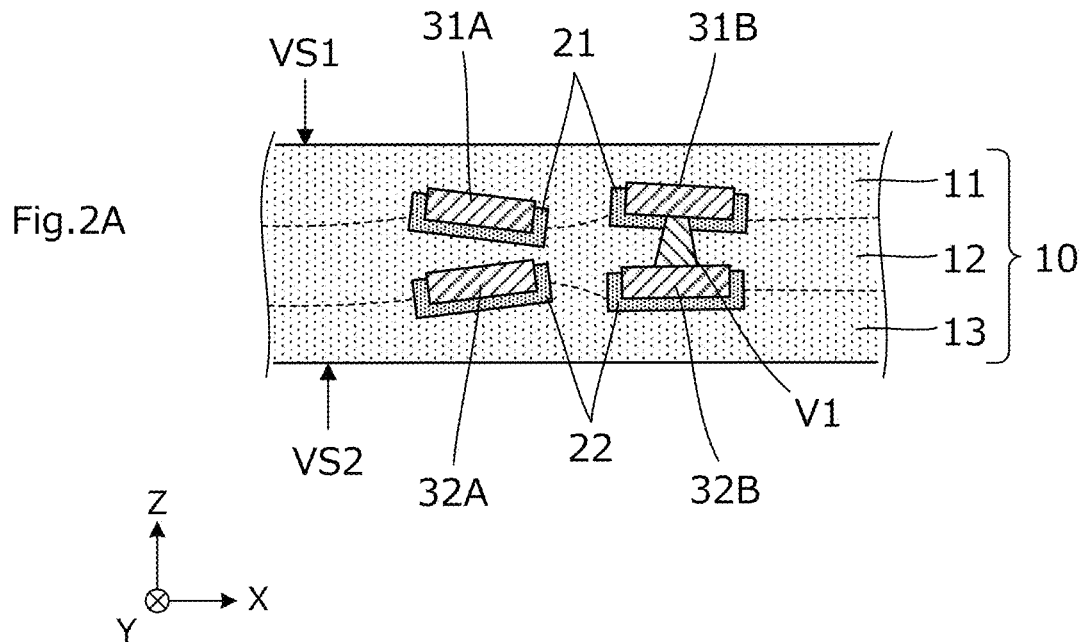
FIGS. 2A and 2B are partial cross-sectional views illustrating an internal configuration of the resin multilayer substrate 101.
Figure 2B:
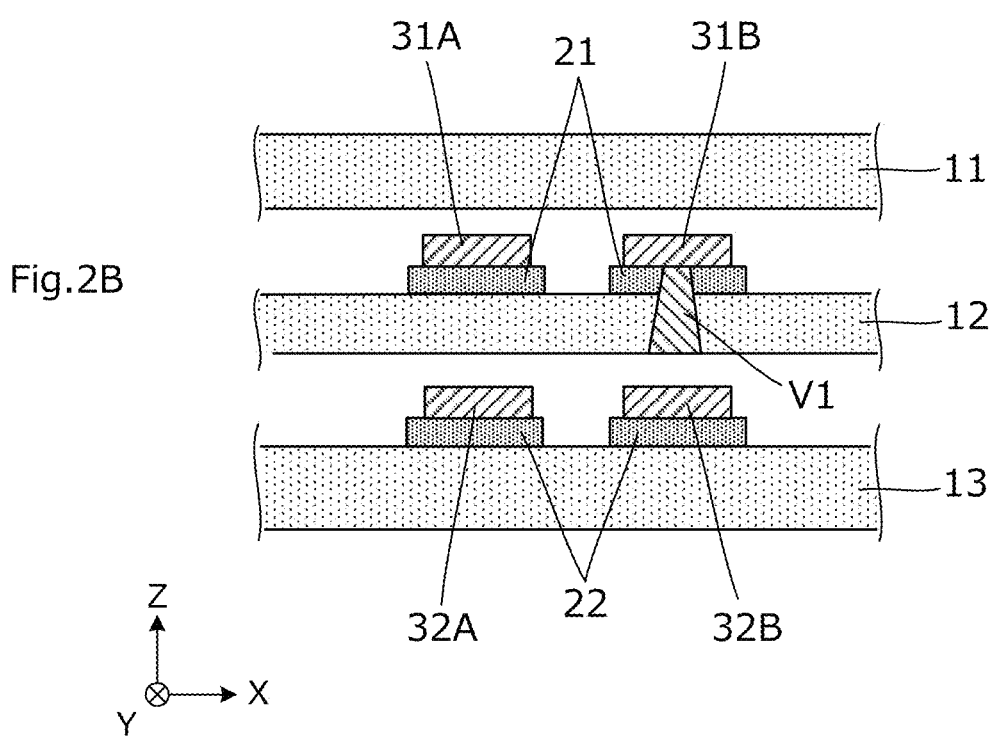

FIG. 1 is an external perspective view of a resin multilayer substrate 101 according to a first preferred embodiment of the present invention. FIGS. 2A and 2B are partial cross-sectional views illustrating an internal configuration of the resin multilayer substrate 101. FIG. 2S is a cross-sectional view of the resin multilayer substrate 101 in a stage after thermocompression bonding, and is a cross-sectional view taken along line A-A in FIG. 1. FIG. 2B is a cross-sectional view of the resin multilayer substrate 101 in a stage before thermocompression bonding.

The resin multilayer substrate 101 includes a stacked body 10, first conductor patterns 31A and 31B, second conductor patterns 32A and 32B, a first protective coating 21, a second protective coating 22, an interlayer connection conductor V1, and the like.

The stacked body 10 is a rectangular or substantially rectangular flat plate whose longitudinal direction coincides with the X-axis direction. The stacked body 10 includes a first main surface VS1 and a second main surface VS2 facing each other. The first conductor patterns 31A and 31B, the second conductor patterns 32A and 32B, the first protective coating 21, the second protective coating 22, and the interlayer connection conductor V1 are provided inside the stacked body 10.

The stacked body 10 is formed by stacking resin layers 13, 12, and 11 in this order and thermocompression bonding them. The resin layers 11, 12, and 13 are all rectangular or substantially rectangular flat plates whose longitudinal directions coincide with the X-axis direction. The resin layers 11, 12, and 13 are resin sheets made from a first thermoplastic resin. The first thermoplastic resin is, for example, a liquid crystal polymer (LCP) or a polyetheretherketone (PEEK).

In the present preferred embodiment, the resin layer 12 corresponds to a "first resin layer," and the resin layer 13 corresponds to a "second resin layer."

Two of the first protective coatings 21 and the first conductor patterns 31A and 31B are provided on the surface side of the resin layer 12. The two first protective coatings 21 are protective films made from second thermoplastic resin that cover a first surface (a lower surface of the first conductor patterns 31A and 31B in FIG. 2A) and a side surface of the first conductor patterns 31A and 31B. The second thermoplastic resin is, for example, fluororesin such as perfluoroalkoxy alkane (PFA) or polytetrafluoroethylene (PTFE). Further, the interlayer connection conductor V1 is provided in the resin layer 12.

Two of the second protective coatings 22 and the second conductor patterns 32A and 32B are provided on the surface side of the resin layer 13. The two second protective coatings 22 are protective films made from the second thermoplastic resin that cover a first surface (a lower surface of the second conductor patterns 32A and 32B in FIG. 2A) and a side surface of the second conductor patterns 32A and 32B.

As illustrated in FIG. 2A, the first conductor pattern 31B and the second conductor pattern 32B partially overlap each other when viewed from the Z-axis direction (a stacking direction of a plurality of the resin layers 11, 12, and 13). The first conductor pattern 31B and the second conductor pattern 32B are connected to each other via the interlayer connection conductor V1.

Further, as illustrated in FIG. 2A, the second conductor patterns 32A and 32B are located on the side opposite to the first conductor patterns 31A and 31B (−Z direction side) with respect to the first protective coating 21. Further, the first protective coating 21 located between the first conductor patterns 31A and 31B and the second conductor patterns 32A and 32B, where at least the first conductor patterns 31A and 31B and the second conductor patterns 32A and 32B are closest to each other.

The resin layers 11 to 13 (the first thermoplastic resin) and the protective coating (the first protective coating 21 and second protective coating 22 made from the second thermoplastic resin) are both resin materials softened (having a storage modulus) at a predetermined press temperature or less. Note that the resin layers 11 to 13 are softened at a temperature lower than that of the protective coating (a temperature equal to or less than a predetermined press temperature and equal to or more than the room temperature). Further, the adhesion between the protective coating and the conductor pattern is higher than the adhesion between the resin layers 11 to 13 and the conductor pattern.

Figure 4:
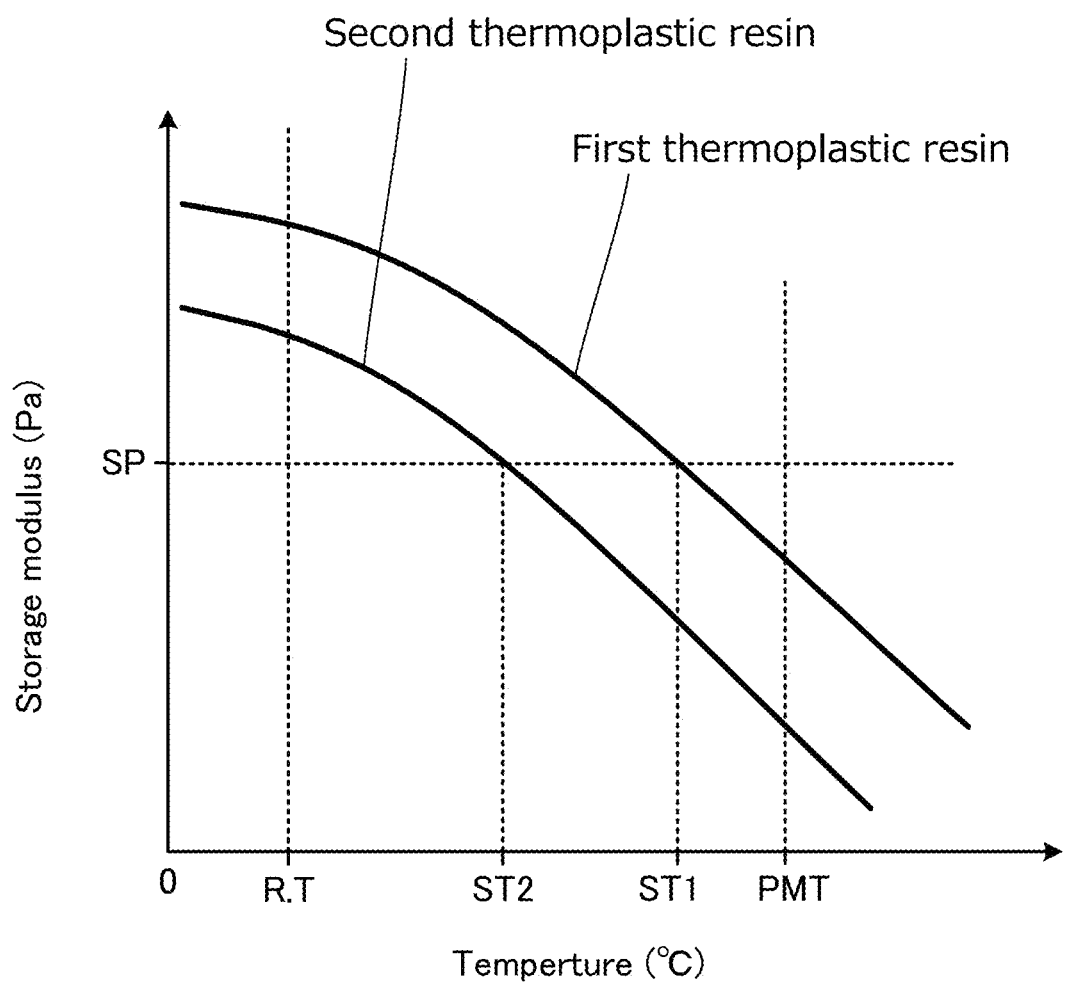
FIG. 4 is a diagram illustrating a relationship between a temperature and a storage modulus of a first thermoplastic resin and a second thermoplastic resin.

The resin multilayer substrate 101 according to the present preferred embodiment is manufactured by, for example, a non-limiting example of a manufacturing method described below. FIG. 3 is a cross-sectional view illustrating a manufacturing step of the resin multilayer substrate 101 in order. FIG. 4 is a diagram illustrating a relationship between a temperature and a storage modulus of the first thermoplastic resin and the second thermoplastic resin. Note that, in FIG. 3, for convenience of explanation, a manufacturing step with one chip (individual piece) will be described. However, an actual manufacturing step of the resin multilayer substrate 101 is performed in a state of an aggregate substrate. The "aggregate substrate" refers to a substrate including a plurality of the resin multilayer substrates 101. R.T in FIG. 4 is the room temperature, and PMT is a maximum temperature at the time of thermocompression bonding.

First, as shown in (1) in FIG. 3, the resin layers 11, 12, and 13 made from the first thermoplastic resin are prepared, the first protective coating 21 is formed on the resin layer 12 (first resin layer), and the second protective coating 22 is formed on the resin layer 13 (second resin layer). The first protective coating 21 and the second protective coating 22 are made from the second thermoplastic resin. After that, the first conductor patterns 31A and 31B are formed on a surface of the first protective coating 21, and the second conductor patterns 32A and 32B are formed on a surface of the second protective coating 22. The first surface (lower surface) of the first conductor patterns 31A and 31B is in contact with the first protective coating 21, and the first surface (lower surface) of the second conductor patterns 32A and 32B is in contact with the second protective coating 22. The second thermoplastic resin is a resin material having a storage modulus at a temperature (a temperature equal to or less than the predetermined press temperature and equal to or more than the room temperature) lower than that of the first thermoplastic resin.

Specifically, after the protective coating is attached to an entire or substantially an entire surface of the resin layers 12 and 13, the first conductor patterns 31A and 31B and the second conductor patterns 32A and 32B are formed on a surface of the protective coating, and the protective coating described above is etched, so that the first protective coating 21 and the second protective coating 22 are formed. The protective coating with the first conductor patterns 31A and 31B and the second conductor patterns 32A and 32B formed on the surface may be attached to the resin layers 12 and 13, and then the protective coating may be etched to form the first protective coating 21 and the second protective coating 22.

The first thermoplastic resin is, for example, a liquid crystal polymer (LCP) or a polyetheretherketone (PEEK). The second thermoplastic resin is fluororesin such as, for example, perfluoroalkoxy alkane (PFA) or polytetrafluoroethylene (PTFE). Further, the first conductor patterns 31A and 31B and the second conductor patterns 32A and 32B are formed by, for example, stacking a metal foil (Cu foil) on a surface of the protective coating and patterning the stacked metal foil by photolithography.

This step of forming the first protective coating 21 on the first resin layer (resin layer 12) is an example of a "coating forming step". Further, this step of forming the first conductor patterns 31A and 31B with the first surface in contact with the first protective coating 21 on the surface of the first protective coating 21 is an example of a "conductor pattern forming step". Note that the "coating forming step" includes a step of forming the second protective coating 22 on the second resin layer (resin layer 13). Further, the "conductor pattern forming step" includes a step of forming the second conductor patterns 32A and 32B with the first surface in contact with the second protective coating 22 on the surface of the second protective coating 22 (step of providing the second conductor pattern on the second resin layer).

Further, the interlayer connection conductor V1 is formed in the resin layer 12. Specifically, the interlayer connection conductor V1 is provided by forming a through hole (a hole penetrating the resin layer 12 and the first protective coating 21) by, for example, a laser or the like from a back surface of the resin layer 12, and then arranging conductive paste including, for example, one or more of Cu, Sn, and the like or an alloy of these and curing the conductive paste by thermocompression bonding (heat pressing) later.

Next, as shown in (2) in FIG. 3, the resin layers 13, 12, and 11 are stacked (placed) in this order. At this time, a plurality of the resin layers 11 to 13 are stacked so that the second conductor patterns 32A and 32B are located on the side opposite to the first conductor patterns 31A and 31B with respect to the first protective coating 21 in the Z-axis direction.

After that, as shown in (3) in FIG. 3, a plurality of the stacked resin layers 11 to 13 are thermocompression-bonded (heat-pressed) at a predetermined press temperature (for example, about 200° C. to about 300° C.), so that the stacked body 10 shown in (4) in 3 is formed.

Specifically, when the second temperature ST2 shown in FIG. 4 is reached during thermocompression bonding, the first protective coating 21 sandwiched between the resin layers 11 and 12 softens and the second protective coating 22 sandwiched between the resin layers 12 and 13 softens. In this manner, a portion of the first conductor patterns 31A and 31B is embedded in the first protective coating 21, and the first surface (lower surface) and a side surface of the first conductor patterns 31A and 31B are covered with the first protective coating 21. Further, in this manner, a portion of the second conductor patterns 32A and 32B is embedded in the second protective coating 22, and the first surface (lower surface) and a side surface of the second conductor patterns 32A and 32B are covered with the second protective coating 22. A second temperature ST2 is a temperature at which the second thermoplastic resin of the protective coating softens, and is, for example, about 100° C. to about 250° C.

In this way, the first surface (a lower surface of the first conductor patterns 31A and 31B in FIG. 3) and a side surface of the first conductor patterns 31A and 31B arranged inside the stacked body 10 are covered with the first protective coating 21. Further, the first surface (a lower surface of the second conductor patterns 32A and 32B in FIG. 3) and a side surface of the second conductor patterns 32A and 32B are covered with the second protective coating 22.

After that, by continuing heating, the temperature rises further, and reaches a first temperature ST1, which is higher than the second temperature ST2, so that surfaces of a plurality of the resin layers 11 to 13 also soften, and an interface between the resin layers 11 to 13 are adhered. The first temperature ST1 is a temperature at which the first thermoplastic resin constituting the resin layers 11 to 13 softens, and is, for example, about 200° C. to about 300° C.

Note that "soften" in the present description means a state in which an object easily flows (softening point SP) and, for example, is a state where a storage modulus is about $10^7$ to $10^9$ Pa. Further, a "softening point" is a temperature at which softening begins.

After that, as the heating is stopped and the temperature is lowered, the resin layers 11 to 13 and the protective coating (the first protective coating 21 and the second protective coating 22) are cured in this order. Note that the second temperature ST2 at which the protective coating softens is lower than the first temperature ST1 at which the resin layers 11 to 13 soften. For this reason, even if the temperature is lowered to a temperature lower than the first temperature ST1 and the resin layers 11 to 13 are cured, the protective coating softens until the temperature becomes below the second temperature ST2. Therefore, even if a gap is generated around the conductor patterns (the first conductor patterns 31A and 31B and the second conductor patterns 32A and 32B) inside the stacked body when the temperature becomes below the first temperature ST1, the shape of the softened protective coating existing around the conductor pattern is changed and the gap is filled.

This step of stacking a plurality of the resin layers 11 to 13 and thermocompression bonding them at a predetermined press temperature to form the stacked body 10, and covering at least the first surface and a side surface of the first conductor patterns 31A and 31B arranged inside the stacked body 10 with the first protective coating 21 is an example of a "stacked body forming step".

According to the above-described manufacturing method according to the present preferred embodiment, advantageous effects described below are obtained.

When a plurality of resin layers stacked so as to cover a conductor pattern with a protective coating formed on the first surface with the resin layer are thermocompression bonded, it is difficult to change the shape of the resin layer along the shape of the conductor pattern, and a gap is likely to be generated in the step portion formed by the protective coating and the conductor pattern after thermocompression bonding. Then, in a case where there is a gap at an interface of such different types of materials, layer peeling is likely to occur starting from the gap. In contrast, according to the above-described manufacturing method according to the present preferred embodiment, even when a gap is generated around the conductor pattern (the first conductor patterns 31A and 31B and the second conductor patterns 32A and 32B) when the temperature is lowered to a temperature lower than the first temperature ST1 after heating of thermocompression bonding, the shape of the softened protective coating (the first protective coating 21 and the second protective coating 22) existing around the conductor pattern is changed and the gap is filled. That is, according to the above-described manufacturing method, it is not necessary to apply high pressure or high temperature during thermocompression bonding so as not to generate a gap inside the stacked body.

After heating by thermocompression bonding, the resin layers 11 to 13 (the first thermoplastic resin) are cured before the protective coating (the second thermoplastic resin) as the temperature is lowered. In this manner, the protective coating in a softened state is restrained by the surrounding resin (the first thermoplastic resin), so that large flow of the protective coating is reduced or prevented, and large deformation and misalignment of the conductor pattern are reduced or prevented.

Further, for example, in a case where the protective coating is made of an oxide film, a heating step or the like for forming the oxide film on the surface of the conductor pattern provided on the resin layer is required, which complicates the manufacturing step. Furthermore, when a high temperature is applied in the heating step, the conductor pattern may be deformed or misaligned due to flow of the resin layer, and an electrical characteristic of the resin multilayer substrate after thermocompression bonding may change. In contrast, according to the above-described manufacturing method, the resin multilayer substrate 101 having a structure in which at least the first surface and a side surface of the conductor pattern (the first conductor patterns 31A and 31B and the second conductor patterns 32A and 32B) are covered with the protective coating can be obtained only by thermocompression bonding (heat pressing) a plurality of the resin layers 11 to 13. For this reason, the number of manufacturing steps of the resin multilayer substrate 101 is reduced, and the cost can be reduced.

As described above, according to the above-described manufacturing method, the resin multilayer substrate 101 in which, while short circuiting between the conductor patterns is reduced or prevented, generation of a gap inside the stacked body after thermocompression bonding and a change in an electrical characteristic due to deformation and misalignment of the conductor patterns can be easily obtained.

Figure 5:
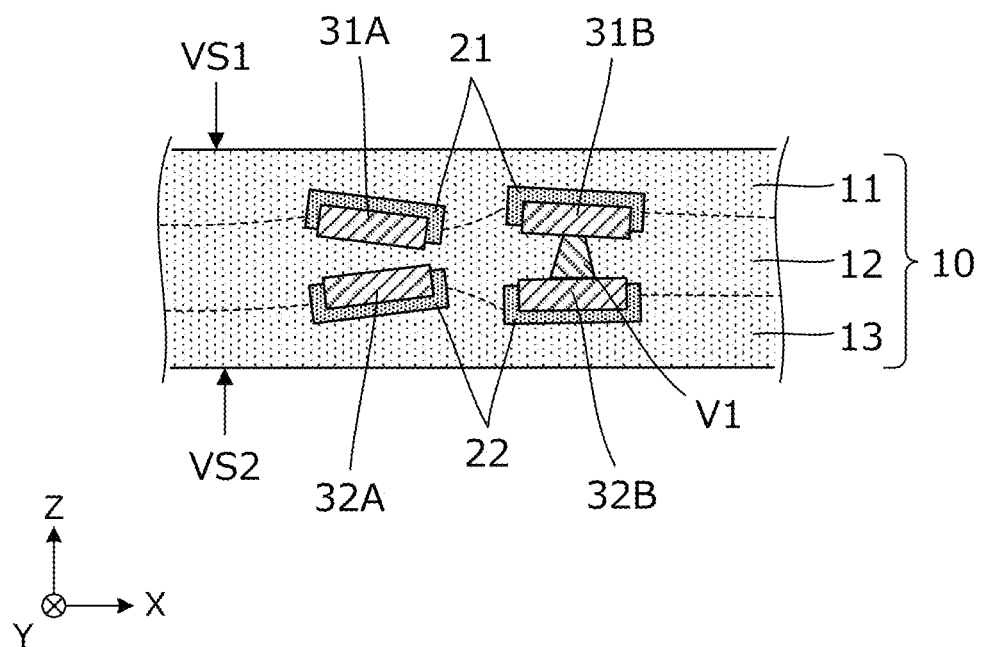
FIG. 5 is a partial cross-sectional view illustrating an internal configuration of a resin multilayer substrate 100 as a comparative example.

Next, advantageous effects of the resin multilayer substrate 101 according to the present preferred embodiment will be described with reference to a comparative example. FIG. 5 is a partial cross-sectional view illustrating an internal configuration of the resin multilayer substrate 100 as a comparative example.

The resin multilayer substrate 100, which is a comparative example, is different from the resin multilayer substrate 101 in that the protective coating is not provided between the first conductor patterns 31A and 31B and the second conductor patterns 32A and 32B facing in the Z-axis direction. That is, the protective coating (the first protective coating 21 and the second protective coating 22) of the resin multilayer substrate 100 is not provided in a location where the first conductor patterns 31A and 31B and the second conductor patterns 32A and 32B are closest to each other. Other configurations of the resin multilayer substrate 100 are the same or substantially the same as those of the resin multilayer substrate 101.

As illustrated in FIG. 5, in a case where the protective coating is not provided between the first conductor patterns 31A and 31B and the second conductor patterns 32A and 32B facing in the Z-axis direction, the first conductor patterns 31A and 31B and the second conductor patterns 32A and 32B may be short-circuited due to misalignment or deformation of the conductor pattern (the first conductor patterns 31A and 31B and the second conductor patterns 32A and 32B) accompanying flow of resin during thermocompression bonding. In contrast, in the resin multilayer substrate 101 according to the present preferred embodiment, the first surface (lower surface) of the first conductor patterns 31A and 31B is covered with the first protective coating 21. Then, the first protective coating 21 is provided in a location between the first conductor patterns 31A and 31B and the second conductor patterns 32A and 32B, where at least the first conductor patterns 31A and 31B and the second conductor patterns 32A and 32B are closest to each other. With this configuration, short circuiting of the first conductor patterns 31A and 31B due to flow of the resin during thermocompression bonding is reduced or prevented.

Further, as described above, in the present preferred embodiment, the first protective coating 21 covering at least the first surface and a side surface of the first conductor patterns 31A and 31B has a storage modulus at a temperature being lower than the resin layers 11 to 13 of the stacked body 10 (a temperature equal to or less than a predetermined press temperature and equal to or more than the room temperature). According to this configuration, even if a gap is generated around the first conductor patterns 31A and 31B after the temperature is lowered and the resin layers 11 to 13 are cured after heating at the time of forming the stacked body, the above gap is filled with the softened first protective coating 21 existing around the first conductor patterns 31A and 31B. For this reason, the generation of a gap inside the stacked body 10 after thermocompression bonding is reduced or prevented, and layer peeling starting from the gap is reduced or prevented.

Further, in the present preferred embodiment, the first thermoplastic resin (the resin layers 11 to 13) cures before the second thermoplastic resin (the first protective coating 21 and the second protective coating 22) as the temperature decreases after heating at the time of forming the stacked body. In this manner, the protective coating in a softened state is restrained by the surrounding resin (the first thermoplastic resin), so that large flow of the protective coating is reduced or prevented, and large deformation and misalignment of the conductor pattern (the first conductor patterns 31A and 31B and the second conductor patterns 32A and 32B) are reduced or prevented. For this reason, it is possible to reduce or prevent a change in an electrical characteristic due to deformation and misalignment of the conductor pattern after thermocompression bonding.

Furthermore, the resin multilayer substrate 101 according to the present preferred embodiment includes not only the first protective coating 21 but also the second protective coating 22 that covers at least the first surface and a side surface of the second conductor patterns 32A and 32B. With this configuration, not only short circuiting of the first conductor patterns 31A and 31B but also short circuiting between the second conductor patterns 32A and 32B and another conductor pattern (not shown) can be reduced or prevented.

Further, in the resin multilayer substrate 101 according to the present preferred embodiment, the protective coating (the first protective coating 21 and the second protective coating 22) having a smaller dielectric loss than a dielectric loss of the resin layers 11 to 13 covers at least a portion of the conductor pattern (the first conductor patterns 31A and 31B and the second conductor patterns 32A and 32B). More specifically, a dielectric loss tangent of the protective coating is smaller than a dielectric loss tangent of the resin layers 11 to 13. With this configuration, the dielectric loss can be reduced as compared with a resin multilayer substrate including only a resin layer with a relatively high dielectric loss tangent. Furthermore, a relative dielectric constant of the protective coating is lower than a relative dielectric constant of the resin layers 11 to 13. For this reason, in a case where a circuit having a predetermined characteristic is provided on a resin multilayer substrate, a line width of the conductor pattern on the stacked body 10 can be increased, and a conductor loss of the circuit can be reduced. Further, in a case where a circuit having a predetermined characteristic is provided on a resin multilayer substrate, the resin layer can be thinned without narrowing a line width of the conductor pattern, and the stacked body 10 can be thinned.

Furthermore, in the resin multilayer substrate 101, an edge portion of the conductor pattern (a side surface, a lower left corner portion, and a lower right corner portion of the first conductor patterns 31A and 31B and the second conductor patterns 32A and 32B in FIG. 2A) is covered with the protective coating having a relatively low dielectric loss. The edge portion of the conductor pattern has a relatively high current density compared to other portions of the conductor pattern. Therefore, according to this configuration, the dielectric loss can be effectively reduced as compared with a case where the protective coating covers a portion other than the edge portion of the conductor pattern.

Further, in the present preferred embodiment, the first conductor patterns 31A and 31B and the second conductor patterns 32A and 32B partially overlap each other when viewed from the Z-axis direction. According to this configuration, the first conductor patterns 31A and 31B and the second conductor patterns 32A and 32B are likely to be tilted or displaced due to flow of the resin during thermocompression bonding. However, even in such a case, short circuiting of the first conductor patterns 31A and 31B is reduced or prevented by the first protective coating 21.

Furthermore, in the present preferred embodiment, the first conductor pattern 31B and the second conductor pattern 32B are connected to each other via the interlayer connection conductor V1. According to this configuration, the strength of a three-dimensional structure including the first conductor pattern 31B, the second conductor pattern 32B, and the like is increased, and deformation, short circuiting, and the like due to flow of the resin during thermocompression bonding are reduced or prevented. Therefore, it is possible to reduce or prevent a change in an electrical characteristic of a circuit provided on the resin multilayer substrate.

Further, in the present preferred embodiment, the adhesion between the protective coating (the first protective coating 21 and the second protective coating 22) and the conductor pattern is higher than the adhesion between the resin layers 11 to 13 and the conductor pattern. According to this configuration, even if the softened resin layers 11 to 13 flow greatly during thermocompression bonding, the state in which a surface of the conductor pattern is coated with the protective coating is maintained, and short circuiting of the conductor patterns during thermocompression bonding can be further reduced or prevented.

Second Preferred Embodiment

In a second preferred embodiment of the present invention, an example of a resin multilayer substrate including a portion where the first conductor pattern and the second conductor pattern do not overlap when viewed from a lamination direction is shown.

Figure 6:
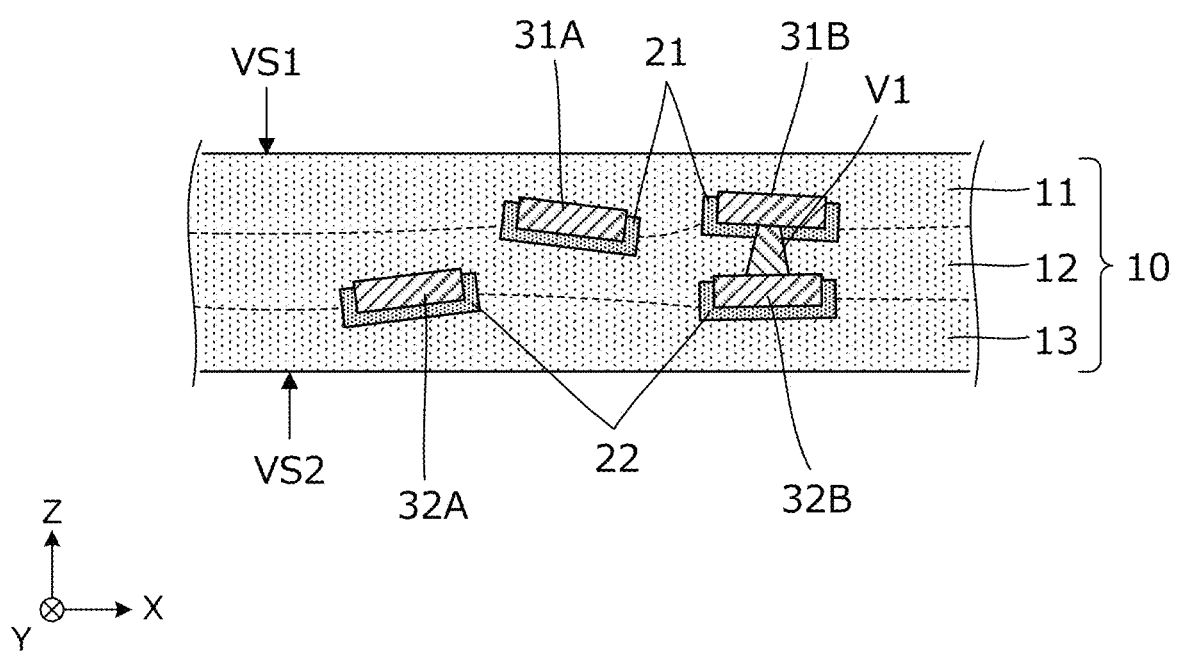
FIG. 6 is a partial cross-sectional view illustrating an internal configuration of a resin multilayer substrate 102 according to a second preferred embodiment of the present invention.

FIG. 6 is a partial cross-sectional view illustrating an internal configuration of a resin multilayer substrate 102 according to the second preferred embodiment.

The resin multilayer substrate 102 is different from the resin multilayer substrate 101 according to the first preferred embodiment in that the first conductor pattern 31A and the second conductor pattern 32A do not overlap (are at positions shifted from each other) when viewed from the Z-axis direction. Other configurations of the resin multilayer substrate 102 are the same or substantially the same as those of the resin multilayer substrate 101.

Even in a case where the first conductor pattern 31A and the second conductor pattern 32A do not overlap in the Z-axis direction as in the present preferred embodiment, short circuiting may occur due to tilt or displacement of the first conductor pattern 31A or the second conductor pattern 32A due to resin flow during thermocompression bonding. For this reason, since covering at least one side and a side surface of the first conductor pattern 31A with the first protective coating 21 reduces or prevents short circuiting between the first conductor pattern 31A and the second conductor pattern 32A, it is effective to provide the first protective coating 21 in a location where the first conductor pattern 31A and the second conductor pattern 32A are closest to each other (the lower left end side of the first conductor pattern 31A in FIG. 6).

Third Preferred Embodiment

A third preferred embodiment of the present invention shows an example of a resin multilayer substrate in which the protective coating covers a portion of a second surface in addition to the first surface and a side surface of the conductor pattern.

Figure 7A:
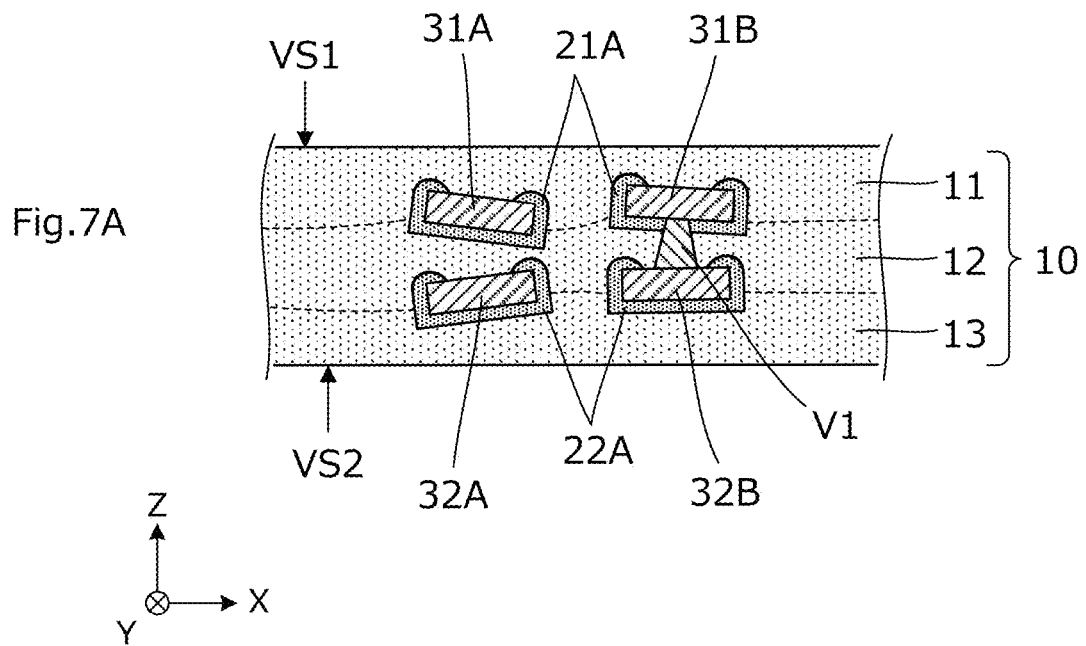
FIGS. 7A and 7B are partial cross-sectional views illustrating an internal configuration of a resin multilayer substrate 103 according to a third preferred embodiment of the present invention.
Figure 7B:
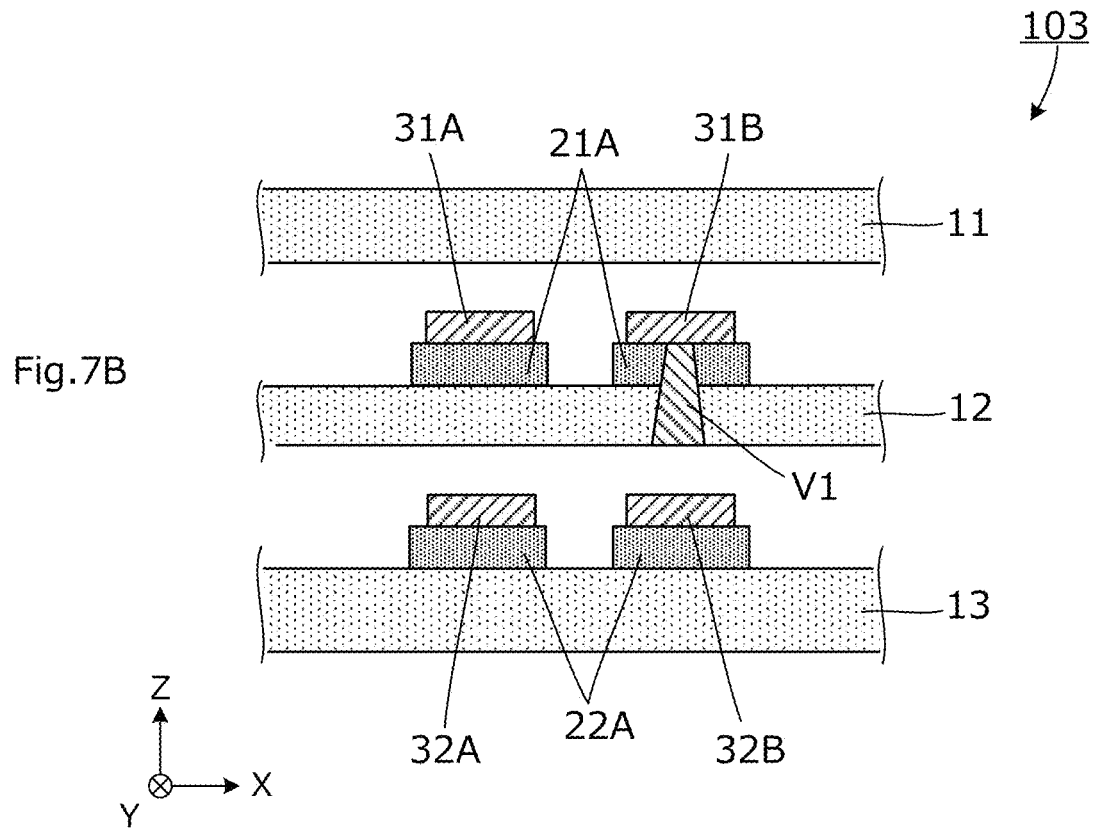

FIGS. 7A and 7B are partial cross-sectional views illustrating an internal configuration of a resin multilayer substrate 103 according to the third preferred embodiment. FIG. 7A is a cross-sectional view of the resin multilayer substrate 103 in a stage after thermocompression bonding, and FIG. 7B is a cross-sectional view of the resin multilayer substrate 103 in a stage before thermocompression bonding.

The resin multilayer substrate 103 is different from the resin multilayer substrate 101 according to the first preferred embodiment in that the resin multilayer substrate 103 includes a first protective coating 21A that covers the first surface, a side surface, and a portion of the second surface of the first conductor patterns 31A and 31B. Further, the resin multilayer substrate 103 is different from the resin multilayer substrate 101 in that the resin multilayer substrate 103 includes a second protective coating 22A that covers the first surface, a side surface, and a portion of the second surface of the second conductor patterns 32A and 32B. Other configurations of the resin multilayer substrate 103 are the same or substantially the same as those of the resin multilayer substrate 101.

In the present preferred embodiment, not only the first surface and a side surface of the first conductor patterns 31A and 31B but also a portion of the second surface (upper surface) is covered with the first protective coating 21A. According to this configuration, short circuiting between the first conductor patterns 31A and 31B and another conductor pattern can be further reduced or prevented. This also applies to the second conductor patterns 32A and 32B.

The resin multilayer substrate 103 according to the present preferred embodiment is manufactured by, for example, a non-limiting example of a manufacturing method described below.

First, the resin layers 11, 12, and 13 made from the first thermoplastic resin are prepared. Next, the first protective coating 21A and the second protective coating 22A made from the second thermoplastic resin are formed on the resin layers 12 and 13, respectively (coating forming step). After that, the first conductor patterns 31A and 31B are formed on a surface of the first protective coating 21A, and the second conductor patterns 32A and 32B are formed on a surface of the second protective coating 22A (conductor pattern forming step). Further, the interlayer connection conductor V1 is formed in the resin layer 12.

As illustrated in FIG. 7B, a line width of the protective coating (the first protective coating 21A and the second protective coating 22A) before thermocompression bonding is wider than a line width of the conductor pattern (the first conductor patterns 31A and 31B and the second conductor patterns 32A and 32B).

Next, the resin layers 13, 12, and 11 are stacked (placed) in this order, and a plurality of the stacked resin layers 11 to are thermocompression-bonded (collectively pressed) at a predetermined press temperature to form the stacked body 10 (stacked body formation step).

During thermocompression bonding, the first protective coating 21A formed to be wider than the first conductor patterns 31A and 31B is wrapped around not only to the first surface (lower surface) and a side surface of the first conductor patterns 31A and 31B but also to the second surface (upper surface). In this manner, the first protective coating 21A after thermocompression bonding covers the first surface, a side surface, and at least a portion of the second surface of the first conductor patterns 31A and 31B.

Similarly, during thermocompression bonding, the second protective coating 22A formed to be wider than the second conductor patterns 32A and 32B is wrapped around not only to the first surface and a side surface of the second conductor patterns 32A and 32B but also to the second surface. In this manner, the second protective coating 22A after thermocompression bonding covers the first surface, a side surface, and at least a portion of the second surface of the second conductor patterns 32A and 32B.

Note that, in the present preferred embodiment, an example in which the protective coating covers the first surface, a side surface, and a portion of the second surface after thermocompression bonding as the line width of the protective coating before thermocompression bonding is wider than the line width of the conductor pattern is shown. However, the present invention is not limited to this method. For example, by forming the protective coating before thermocompression bonding having a large thickness (thickness in the lamination direction), the protective coating may be wrapped around to the second surface after thermocompression bonding. That is, a coverage range and amount of the protective coating on the second surface of the conductor pattern can be adjusted by the line width and thickness of the protective coating before thermocompression bonding.

Fourth Preferred Embodiment

A fourth preferred embodiment of the present invention shows an example of a resin multilayer substrate in which the protective coating covers the entire or substantially the entire circumference of the conductor pattern (the first surface, the second surface, and the entire surface of a side surface).

Figure 8A:
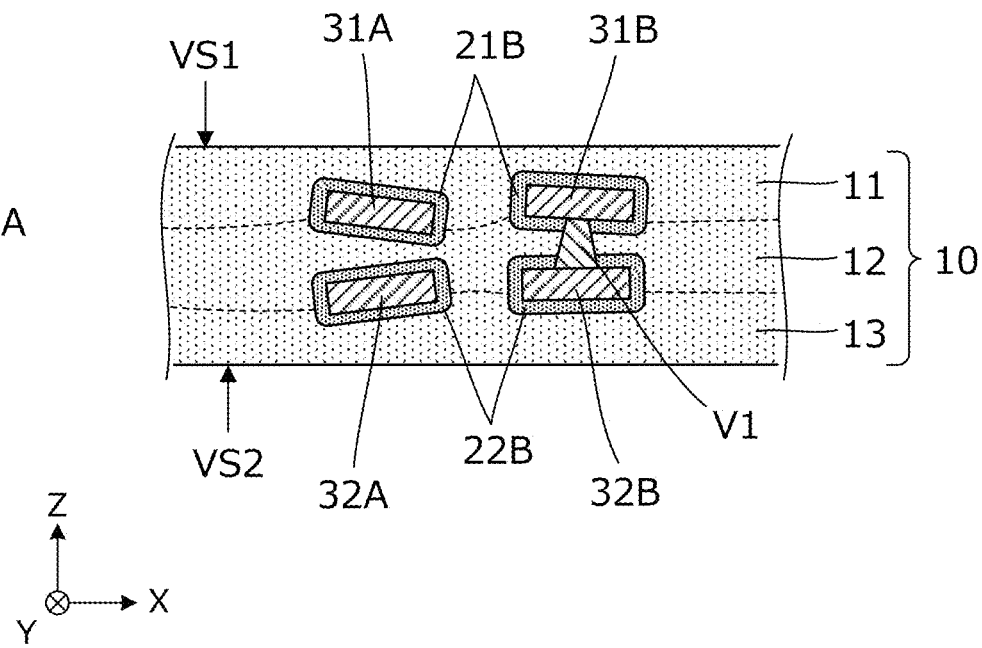
FIGS. 8A and 8B are partial cross-sectional views illustrating an internal configuration of a resin multilayer substrate 104 according to a fourth preferred embodiment of the present invention.
Figure 8B:
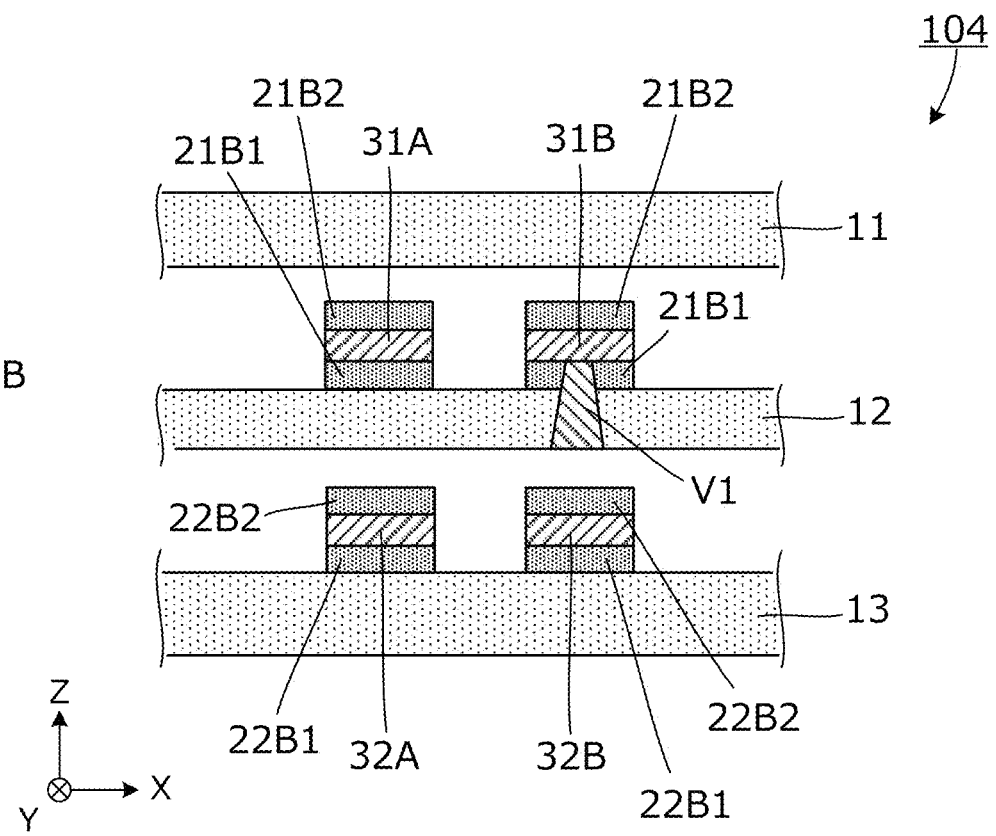

FIGS. 8A and 8B are partial cross-sectional views illustrating an internal configuration of a resin multilayer substrate 104 according to the fourth preferred embodiment. FIG. 8A is a cross-sectional view of the resin multilayer substrate 104 in a stage after thermocompression bonding, and FIG. 8B is a cross-sectional view of the resin multilayer substrate 104 in a stage before thermocompression bonding.

The resin multilayer substrate 104 is different from the resin multilayer substrate 103 according to the third preferred embodiment in that the resin multilayer substrate 104 includes a first protective coating 21B that covers the entire or substantially the entire circumference of the first conductor patterns 31A and 31B. Further, the resin multilayer substrate 104 is different from the resin multilayer substrate 103 in that the resin multilayer substrate 104 includes a second protective coating 22B that covers the entire or substantially the entire circumference of the second conductor patterns 32A and 32B. Other configurations of the resin multilayer substrate 104 are the same or substantially the same as those of the resin multilayer substrate 103.

Note that, in the present description, "covering the entire or substantially the entire circumference" means covering the entire or substantially the entire or substantially the entire circumference (entire surface) of the conductor pattern. However, in a case where the interlayer connection conductor V1 is connected to the conductor pattern (the first conductor pattern 31B and the second conductor pattern 32B) as in the present preferred embodiment, "covering the entire or substantially the entire circumference" applies as long as the entire or substantially the entire circumference excluding a portion in contact with the interlayer connection conductor V1 of the above conductor pattern.

In the present preferred embodiment, the entire or substantially the entire circumference of the first conductor patterns 31A and 31B is covered with the first protective coating 21B. According to this configuration, short circuiting between the first conductor patterns 31A and 31B and another conductor pattern can be further reduced or prevented as compared with a case where there is a portion of the first conductor patterns 31A and 31B not covered with the protective coating. This also applies to the second conductor patterns 32A and 32B.

The resin multilayer substrate 104 according to the present preferred embodiment is manufactured by, for example, a non-limiting example of a manufacturing method described below.

First, the resin layers 11, 12, and 13 made from the first thermoplastic resin are prepared, a first protective coating 21B1 is formed on the resin layer 12 (first resin layer), and a second protective coating 22B1 is formed on the resin layer 13 (second resin layer) (coating forming step). After that, the first conductor patterns 31A and 31B are formed on a surface of the first protective coating 21B1, and the second conductor patterns 32A and 32B are formed on a surface of the second protective coating 22B1. The first surface (lower surface) of the first conductor patterns 31A and 31B is in contact with the first protective coating 21B1, and the first surface (lower surface) of the second conductor patterns 32A and 32B is in contact with the second protective coating 22B1. Further, the interlayer connection conductor V1 is formed in the resin layer 12.

As illustrated in FIG. 8B, a line width of the protective coating (the first protective coating 21B1 and the second protective coating 22B1) before thermocompression bonding is substantially the same as a line width of the conductor pattern (the first conductor patterns 31A and 31B and the second conductor patterns 32A and 32B). The protective coating before thermocompression bonding has the same or substantially the same shape as the conductor pattern.

After the above (after the conductor pattern forming step), a protective coating 21B2 is further formed on the second surface of the first conductor patterns 31A and 31B (a surface opposite to the first surface in contact with the first protective coating 21B1 of the first conductor patterns 31A and 31B) (coating forming step). Further, the protective coating 22B2 is further formed on the second surface of the second conductor patterns 32A and 32B (coating forming step).

After the above, the resin layers 13, 12, and 11 are stacked (placed) in this order, and a plurality of the stacked resin layers 11 to 13 are thermocompression-bonded (heat pressed) at a predetermined press temperature to form the stacked body 10 (stacked body formation step).

During thermocompression bonding, the first protective coating 21B1 arranged on the first surface (lower surface) of the first conductor patterns 31A and 31B and the protective coating 21B2 arranged on the second surface (upper surface) are wrapped around to a side surface of the first conductor patterns 31A and 31B and integrated. In this manner, the first protective coating 21B that covers the entire or substantially the entire circumference of the first conductor patterns 31A and 31B is formed.

Similarly, during thermocompression bonding, the second protective coating 22B1 arranged on the first surface (lower surface) of the second conductor patterns 32A and 32B and the protective coating 22B2 arranged on the second surface (upper surface) are wrapped around to a side surface of the second conductor patterns 32A and 32B and integrated. In this manner, the second protective coating 22B that covers the entire or substantially the entire circumference of the second conductor patterns 32A and 32B is formed.

Fifth Preferred Embodiment

In a fifth preferred embodiment of the present invention, an example of a resin multilayer substrate on which a coil is provided is shown.

Figure 9:
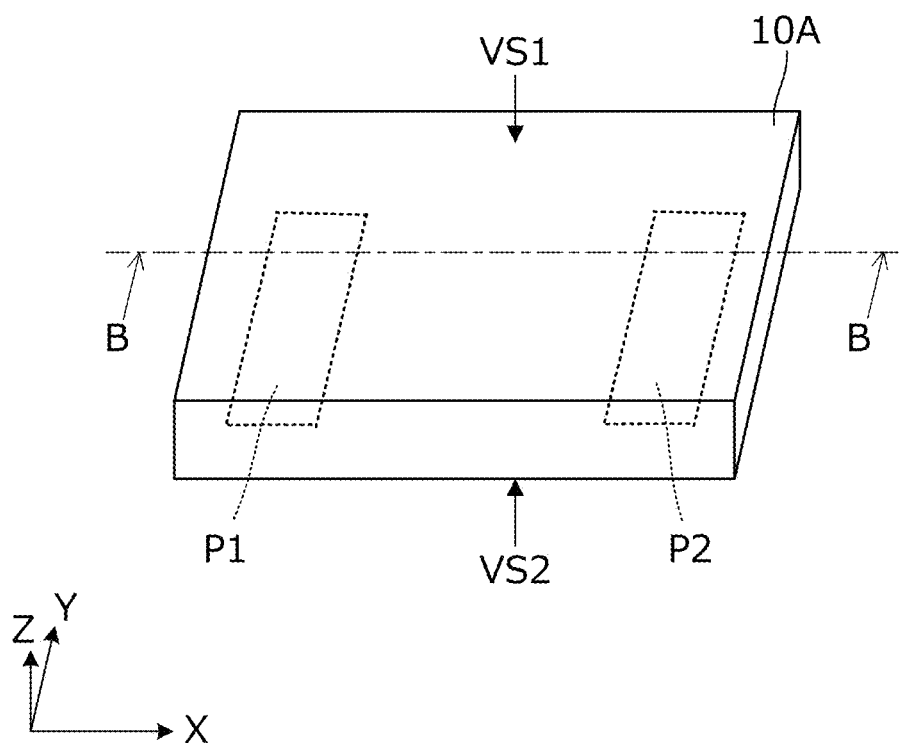
FIG. 9 is an external perspective view of a resin multilayer substrate 105 according to a fifth preferred embodiment of the present invention.
Figure 11A:
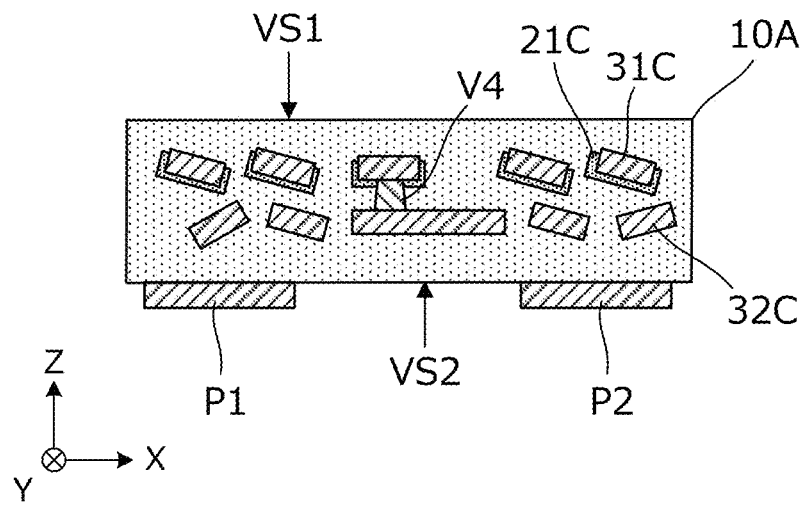
FIGS. 11A and 11B are cross-sectional views illustrating an internal configuration of the resin multilayer substrate 105.
Figure 11B:
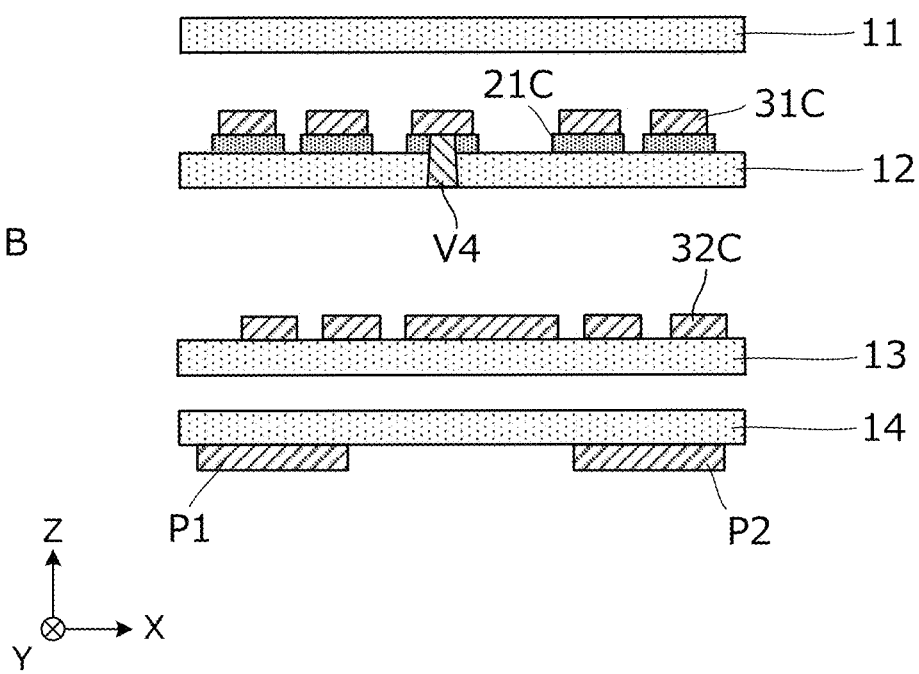

FIG. 9 is an external perspective view of a resin multilayer substrate 105 according to the fifth preferred embodiment. FIG. 10 is an exploded perspective view of the resin multilayer substrate 105. FIGS. 11A and 11B are cross-sectional views illustrating an internal configuration of the resin multilayer substrate 105. FIG. 11A is a cross-sectional view of the resin multilayer substrate 105 in a stage after thermocompression bonding, and is a cross-sectional view taken along line B-B in FIG. 9. FIG. 11B is a cross-sectional view of the resin multilayer substrate 105 in a stage before thermocompression bonding.

The resin multilayer substrate 105 includes a stacked body 10A, a first conductor pattern 31C, a second conductor pattern 32C, a conductor pattern 33C, external electrodes P1 and P2, a first protective coating 21C, the interlayer connection conductors V1, V2, V3, V4, V5, and V6, and the like. The first conductor pattern 31C, the second conductor pattern 32C, the conductor pattern 33C, the first protective coating 21C, and the interlayer connection conductors V1 to V6 are provided inside the stacked body 10A, and the external electrodes P1 and P2 are provided on the second main surface VS2 of the stacked body 10A.

An outer shape of the stacked body 10A is the same or substantially the same as that of the stacked body 10 described in the first preferred embodiment. The stacked body 10A is formed by stacking the resin layers 14, 13, 12, and 11 in this order and thermocompression bonding them. An outer shape and a material of the resin layers 11, 12, 13, and 14 are the same or substantially the same as those of the resin layers 11 to 13 described in the first preferred embodiment.

In the present preferred embodiment, the resin layer 12 corresponds to a "first resin layer", and the resin layer 13 corresponds to a "second resin layer".

The first protective coating 21C and the first conductor pattern 31C are provided on the surface side of the resin layer 12. The first conductor pattern 31C is a rectangular or substantially rectangular spiral coil conductor pattern including about two turns provided near the center of the resin layer 12, and includes a winding axis in the Z-axis direction. A planar shape of the first protective coating 21C is the same or substantially the same as that of the first conductor pattern 31C. The first protective coating 21C covers the first surface of the first conductor pattern 31C (a lower surface of the first conductor pattern 31C in FIG. 10A) and a side surface. The first conductor pattern 31C is a conductor pattern of Cu foil or the like, for example. The material of the first protective coating 21C is the same as that of the first protective coating 21 described in the first preferred embodiment. Further, the interlayer connection conductors V3 and V4 are provided in the resin layer 12.

The second conductor pattern 32C and the conductor pattern 33C are provided on a surface of the resin layer 13. The second conductor pattern 32C is a rectangular or substantially rectangular spiral coil conductor pattern including about 1.5 turns provided near the center of the resin layer 13, and includes a winding axis in the Z-axis direction. The conductor pattern 33C is a rectangular or substantially rectangular conductor pattern provided near a first corner of the resin layer 13 (an upper left corner of the resin layer 13 in FIG. 10). The second conductor pattern 32C and the conductor pattern 33C are conductor patterns of Cu foil or the like, for example. Further, the interlayer connection conductors V2 and V5 are provided in the resin layer 13.

The external electrodes P1 and P2 are provided on a back surface of the resin layer 14. The external electrode P1 is a rectangular or substantially rectangular conductor pattern provided near a first side of the resin layer 14 (the left side of the resin layer 14 in FIG. 10). The external electrode P2 is a rectangular or substantially rectangular conductor pattern provided near a second side of the resin layer 14 (the right side of the resin layer 14 in FIG. 10). The external electrodes P1 and P2 are conductor patterns of Cu foil or the like, for example. Further, the interlayer connection conductors V1 and V6 are provided in the resin layer 14.

As illustrated in FIG. 10, a first end of the first conductor pattern 31C is connected to one end of the second conductor pattern 32C via the interlayer connection conductor V4. As described above, in the present preferred embodiment, a coil is provided by the first conductor pattern 31C, the second conductor pattern 32C, and the interlayer connection conductor V4. Further, both ends of the coil are connected to the external electrodes P1 and P2. Specifically, a second end of the first conductor pattern 31C is connected to the external electrode P1 via the conductor pattern 33C and the interlayer connection conductors V1, V2, and V3. A second end of the second conductor pattern 32C is connected to the external electrode P2 via the interlayer connection conductors V5 and V6.

The first conductor pattern 31C and the second conductor pattern 32C according to the present preferred embodiment are coil conductor patterns including a winding axis in the Z-axis direction. According to this configuration, a structure where short circuiting is unlikely to occur even when the first conductor pattern 31C and the second conductor pattern 32C are provided at a high density, in a case where a coil device including a large number of turns while reduction in size is achieved is obtained or in a case where an inductor having a large inductance per unit volume is obtained.

Note that, as shown in the present preferred embodiment, the second protective coating is not essential. If the first protective coating 21C (the protective coating that covers at least the first surface and a side surface of the first conductor pattern 31C) is provided, the advantageous actions and effects of preferred embodiments of the present invention can be obtained. However, the second protective coating is preferably further included to reduce or prevent short circuiting between the conductor patterns during thermocompression bonding. Note that, in a case where the second protective coating is not provided as in the present preferred embodiment, the second conductor pattern may be provided on a surface (main surface or the like) of the stacked body.

Other Preferred Embodiments

Each of the above-described preferred embodiments shows an example in which the stacked body is a rectangular or substantially rectangular flat plate with a longitudinal direction in the X-axis direction. However, the shape of the stacked body is not limited to this. The shape of the stacked body can be appropriately changed as long as the advantageous actions and effects of preferred embodiments the present invention are obtained. The planar shape of the stacked body may be, for example, a rectangle, a polygon, an L-shape, a crank shape, a T-shape, a Y-shape, or the like.

Further, each of the above-described preferred embodiments shows an example of the stacked body formed by thermocompression bonding three or four resin layers. However, the stacked bodies of preferred embodiments of the present invention are not limited to this. The number of layers of the resin layer of the stacked body can be appropriately changed, and may be two or five or more. Further, the stacked body may include an adhesive layer in addition to the resin layer. Furthermore, a protective film such as, for example, a coverlay film or a resist film may be provided on a surface of the stacked body.

Further, the circuit configuration provided on the resin multilayer substrate is not limited to the configuration of each preferred embodiment shown above, and can be appropriately changed as long as the advantageous actions and effects of preferred embodiments of the present invention are obtained. As the circuit provided on the resin multilayer substrate, for example, a capacitor including a conductor pattern, a frequency filter such as various filters (low-pass filter, high-pass filter, band-pass filter, and band-elimination filter), or the like may be provided. Further, various transmission lines (for example, strip line, microstrip line, coplanar line, and the like) may be provided on the resin multilayer substrate. Furthermore, various electronic components such as a chip component, for example, may be mounted on or embedded in the resin multilayer substrate.

Note that the shapes, positions, and numbers of the first conductor pattern, the second conductor pattern, and the external electrodes are not limited to those in the configuration of the above-described preferred embodiments, and can be appropriately changed within the range in which the advantageous actions and effects of preferred embodiments of the present invention are obtained. The planar shape of the first conductor pattern, the second conductor pattern, and the external electrode may be, for example, polygonal, circular, elliptical, arc-shaped, ring-shaped, L-shaped, U-shaped, T-shaped, Y-shaped, crank-shaped, or the like. Further, the configuration may be such that the external electrode is provided only on the first main surface VS1 or is provided on both the first main surface VS1 and the second main surface VS2. Furthermore, the resin multilayer substrate may include a dummy electrode in addition to these conductor patterns.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a stacked body including a plurality of resin layers made of a first thermoplastic resin and stacked;
   a first conductor pattern inside the stacked body;
   a first protective coating made of a second thermoplastic resin, the first protective coating being inside the stacked body and covering at least a first surface and a side surface of the first conductor pattern; and
   a second conductor pattern on the stacked body and in a layer on a side of the first surface of the first conductor pattern; wherein
   the plurality of resin layers include a first resin layer made of the first thermoplastic resin, thicker than the first protective coating, and provided between the first conductor pattern and the second conductor pattern;
   the first thermoplastic resin and the second thermoplastic resin soften at a predetermined press temperature or less; and
   the second thermoplastic resin has a storage modulus lower than a storage modulus of the first thermoplastic resin at a temperature equal to or less than the predetermined press temperature and equal to or more than room temperature.

2. A resin multilayer substrate comprising:
   a stacked body including a plurality of resin layers made of a first thermoplastic resin and stacked;
   a first conductor pattern inside the stacked body;
   a first protective coating made of a second thermoplastic resin, the first protective coating being inside the stacked body and covering at least a first surface and a side surface of the first conductor pattern; and
   a second conductor pattern on the stacked body and in a layer on a side of the first surface of the first conductor pattern; wherein
   the plurality of resin layers include a first resin layer made of the first thermoplastic resin, thicker than the first protective coating, and provided between the first conductor pattern and the second conductor pattern;
   the first thermoplastic resin and the second thermoplastic resin soften at a predetermined press temperature or less; and
   the second thermoplastic resin has a softening point lower than a softening point of the first thermoplastic resin.

3. The resin multilayer substrate according to claim 1, wherein the first protective coating covers at least a portion of a second surface opposing the first surface of the first conductor pattern.

4. The resin multilayer substrate according to claim 3, wherein the first protective coating covers an entire or substantially an entire circumference of the first conductor pattern.

5. The resin multilayer substrate according to claim 1, wherein the first protective coating is in a location between the first conductor pattern and the second conductor pattern where at least the first conductor pattern and the second conductor pattern are closest to each other.

6. The resin multilayer substrate according to claim 5, wherein the first conductor pattern and the second conductor pattern are located at positions shifted from each other when viewed from a lamination direction of the plurality of resin layers.

7. The resin multilayer substrate according to claim 5, wherein the first conductor pattern and the second conductor pattern partially overlap each other when viewed from a lamination direction of the plurality of resin layers.

8. The resin multilayer substrate according to claim 7, further comprising:
an interlayer connection conductor in the stacked body; wherein
the first conductor pattern and the second conductor pattern are connected to each other via the interlayer connection conductor.

9. The resin multilayer substrate according to claim 5, wherein the first conductor pattern and the second conductor pattern are coil conductor patterns including winding axes extending in a lamination direction of the plurality of resin layers.

10. The resin multilayer substrate according to claim 5, further comprising:
a second protective coating made of the second thermoplastic resin; wherein
the second protective coating is inside the stacked body and covering at least a first surface and a side surface of the second conductor pattern.

11. The resin multilayer substrate according to claim 1, wherein the second thermoplastic resin is a resin material with a smaller dielectric loss than a dielectric loss of the first thermoplastic resin.

12. The resin multilayer substrate according to claim 11, wherein the second thermoplastic resin is fluororesin.

13. The resin multilayer substrate according to claim 2, wherein the first protective coating covers at least a portion of a second surface opposing the first surface of the first conductor pattern.

14. The resin multilayer substrate according to claim 13, wherein the first protective coating covers an entire or substantially an entire circumference of the first conductor pattern.

15. The resin multilayer substrate according to claim 2, wherein the first protective coating is in a location between the first conductor pattern and the second conductor pattern where at least the first conductor pattern and the second conductor pattern are closest to each other.

16. The resin multilayer substrate according to claim 1, wherein the first protective coating is not provided on any portion of a second surface opposing the first surface of the first conductor pattern.

17. The resin multilayer substrate according to claim 1, wherein the first protective coating is provided on a portion of a second surface opposing the first surface of the first conductor pattern, and is not provided on a remaining portion of the second surface of the first conductor pattern.

* * * * *